(12) United States Patent
Lin

(10) Patent No.: US 6,220,884 B1
(45) Date of Patent: Apr. 24, 2001

(54) BGA SOCKET

(75) Inventor: Nick Lin, Hsin-Chuang (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/421,760

(22) Filed: Oct. 19, 1999

(30) Foreign Application Priority Data

Apr. 16, 1999 (TW) .................................. 88205876

(51) Int. Cl.⁷ ........................... H01R 13/625; H01R 4/02
(52) U.S. Cl. .................................. 439/342; 439/83
(58) Field of Search ....................... 439/342, 83, 259–270

(56) References Cited

U.S. PATENT DOCUMENTS 5,658,160 * 8/1997 Lai ........................................ 439/342
5,730,615 * 3/1998 Lai et al. ............................. 439/342

* cited by examiner

Primary Examiner—Gary F. Paumen
(74) Attorney, Agent, or Firm—Wei Te Chung

(57) ABSTRACT

A BGA socket comprises an insulative cover and a base. The base defines a plurality of passageways therein. A plurality of triangular plates projects from edges of the base. A barb is formed on an edge of each triangular plate. The cover defines a plurality of apertures therein for receiving a plurality of terminals. A plurality of elongate standoffs is formed on a bottom surface of the cover with an opening defined in a lateral face of each standoff. The barbs of the base are slidably received in the slots of the cover thereby connecting the base and the cover together. The standoffs of the cover extend beyond a bottom surface of the base.

3 Claims, 6 Drawing Sheets

BGA SOCKET

BACKGROUND OF THE INVENTION

The present invention relates to a BGA socket, and especially to a BGA socket having a plurality of standoffs for stably spacing the BGA socket above a mother board and for eliminating wicking of molten solder.

A PGA (Pin Grid Array) socket is commonly used in a computer for providing electrical connection between an IC (Integral circuit) chip and a mother board for electrical connecting an IC chip to a mother board. The PGA socket is usually connected to corresponding pads on the mother board using Through Hole technology. A plurality of through holes is defined through the mother board for allowing corresponding tails of the socket to extend therethrough. However, the through holes occupy space on both sides of the mother board thereby hindering an efficient use thereof.

To absolve the above problem, a BGA (Ball Grid Array) socket is adopted for connection of the IC chip to the mother board. A plurality of solder balls is disposed between tails of the IC chip and electrical pads on the mother board. The solder balls are heated and become molten thereby electrically connecting the tails to the mother board after the molten solder solidifies. The pertinent prior art is disclosed in Taiwan Patent Application Nos. 86,105,336 and 86,100,612.

Referring to FIGS. 1 and 2, a conventional BGA socket 2 comprises an insulative cover 20 and a base 21 attached to a bottom surface of the cover 20. The cover 20 defines a plurality of apertures (not shown) therein. The base 21 defines a plurality of passageways 22 corresponding to the apertures of the cover 20 for retaining corresponding terminals 24 therein. An IC chip (not shown) is attached to a top surface of the cover 20. A plurality of pins of the IC chip extends through the apertures of the cover 20 into the passageways 22 of the base 21 for engaging with the terminals 24. The terminals 24 are electrically connected to a mother board 3 by melting solder balls 210 disposed therebetween. However, the BGA socket 2 does not have a standoff for supporting the BGA socket 2 above the mother board 3. Thus, the solder balls 210 directly sustain the entire weight of the BGA socket 2. During the heating process, the solder balls 210 are unlikely to become synchronously molten whereby a height of the BGA socket 2 above the mother board 3 is difficult to control. Furthermore, a bottom surface of the base 21 may not be parallel to the mother board 3 due to the nonsynchronous melting process of the solder balls 210. The molten solder may upwardly wick into the passageways 22 thereby adversely affecting performance of the terminals 24. Thus, a BGA socket which can absolve the above problems is desired.

SUMMARY OF THE INVENTION

Accordingly, the primary object of the present invention is to provide a BGA socket having a plurality of standoffs thereby ensuring that the BGA socket is aligned in parallel with a mother board.

Another object of the present invention is to provide a BGA socket which is stably distanced a predetermined height above a mother board.

A further object of the present invention is to provide a BGA socket which prevents wicking of molten solder into passageways thereof.

To fulfill the above-mentioned objects, a BGA socket of the present invention comprises an insulative cover and a base. The base defines a plurality of passageways therein. A plurality of triangular plates projects from edges of the base. A barb is formed on an edge of each triangular plate. The cover defines a plurality of apertures therein in alignment with the passageways of the base. A plurality of terminals is received in the passageways. A plurality of elongate standoffs is formed on a bottom surface of the cover corresponding to the triangular plates of the base. An elongate slot is defined in an edge of each standoff. The barbs of the base are slidably received in the slots of the cover whereby the cover is slidable along the base in a determined direction. The standoffs of the cover extend beyond a bottom surface of the base. A solder ball is disposed between the base and a mother board, and aligned with each passageway and a corresponding electrical pad on the mother board. The solder balls are heated and become molten. A bottom face of each standoff abuts against a top surface of the mother board thereby stably distancing the BGA socket a predetermined height above the mother board whereby a bottom surface of the BGA is parallel to the top surface of the mother board.

Other objects, advantages and novel features of the invention will become more apparent from the following detailed description when taken in conjunction with the accompanying drawings.

DETAILED DESCRIPTION OF A PREFERRED EMBODIMENT

Figure 1:
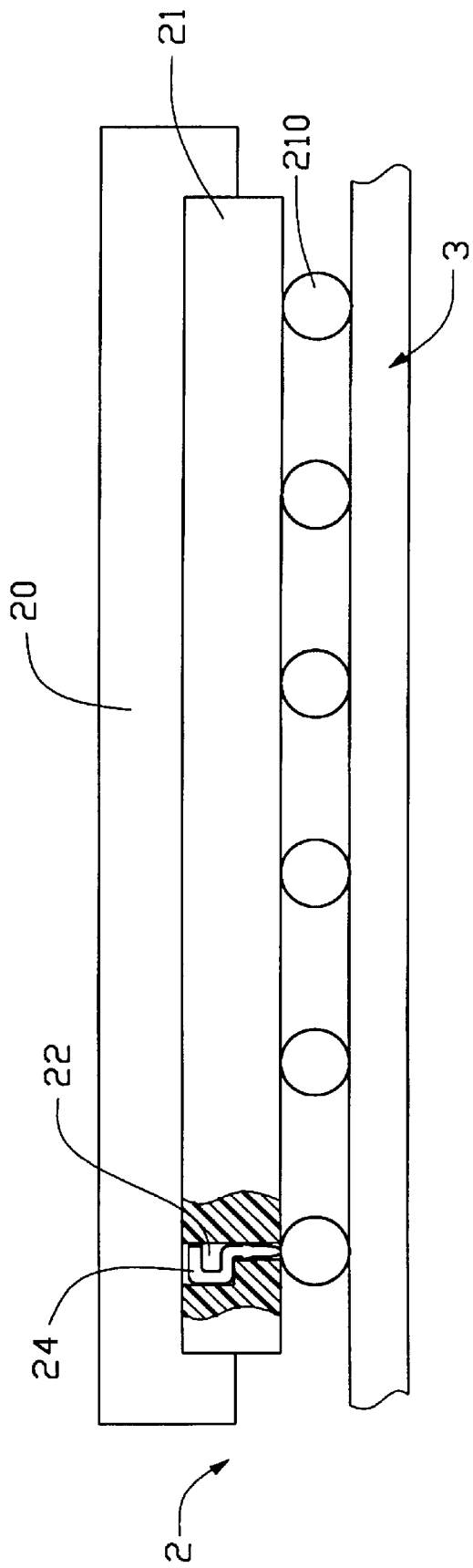
FIG. 1 is a side view showing a conventional BGA socket, a plurality of solder balls and a mother board wherein a base of the BGA socket is partially shown in cross-section.
Figure 2:
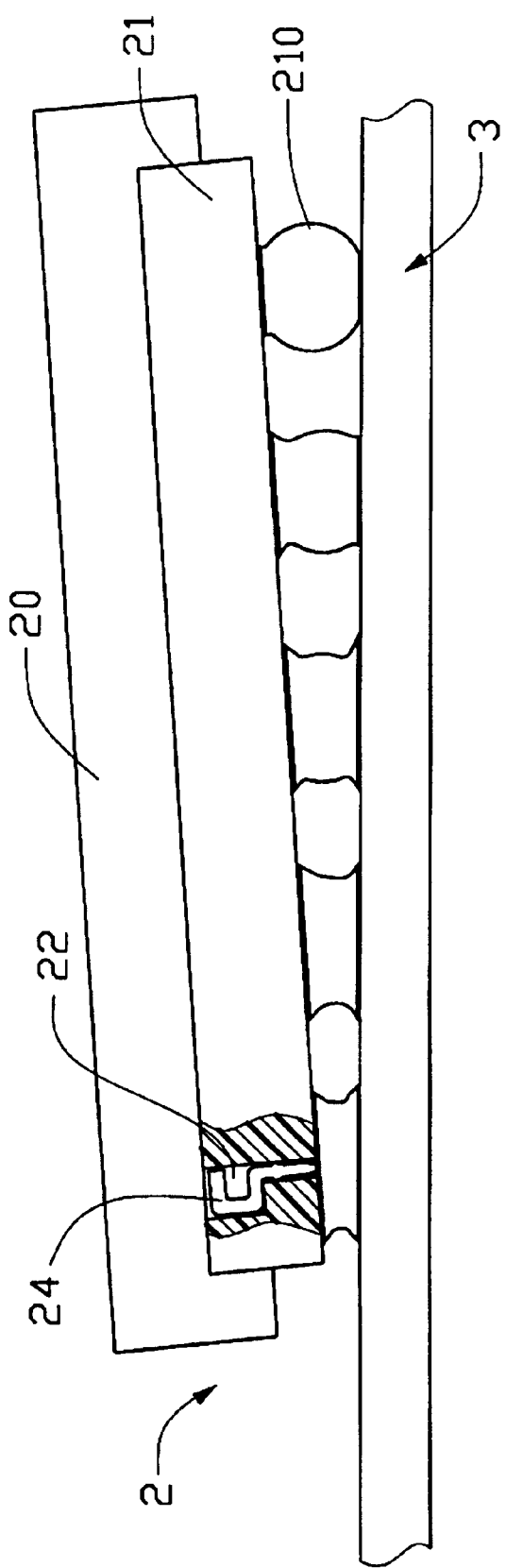
FIG. 2 is similar to FIG. 1 wherein the solder balls are molten.
Figure 3:
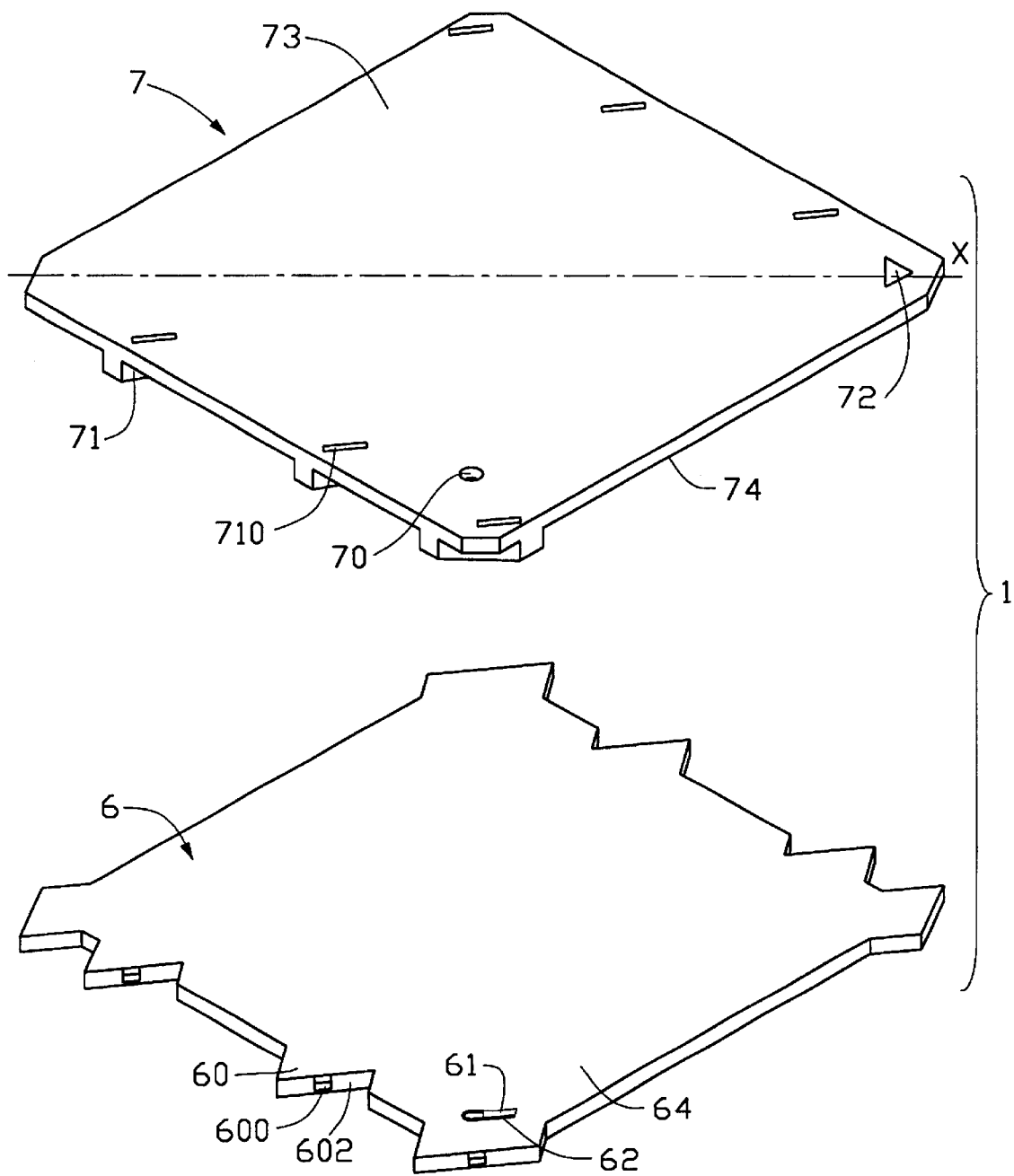
FIG. 3 is an exploded view of a BGA socket in accordance with the present invention.
Figure 4:
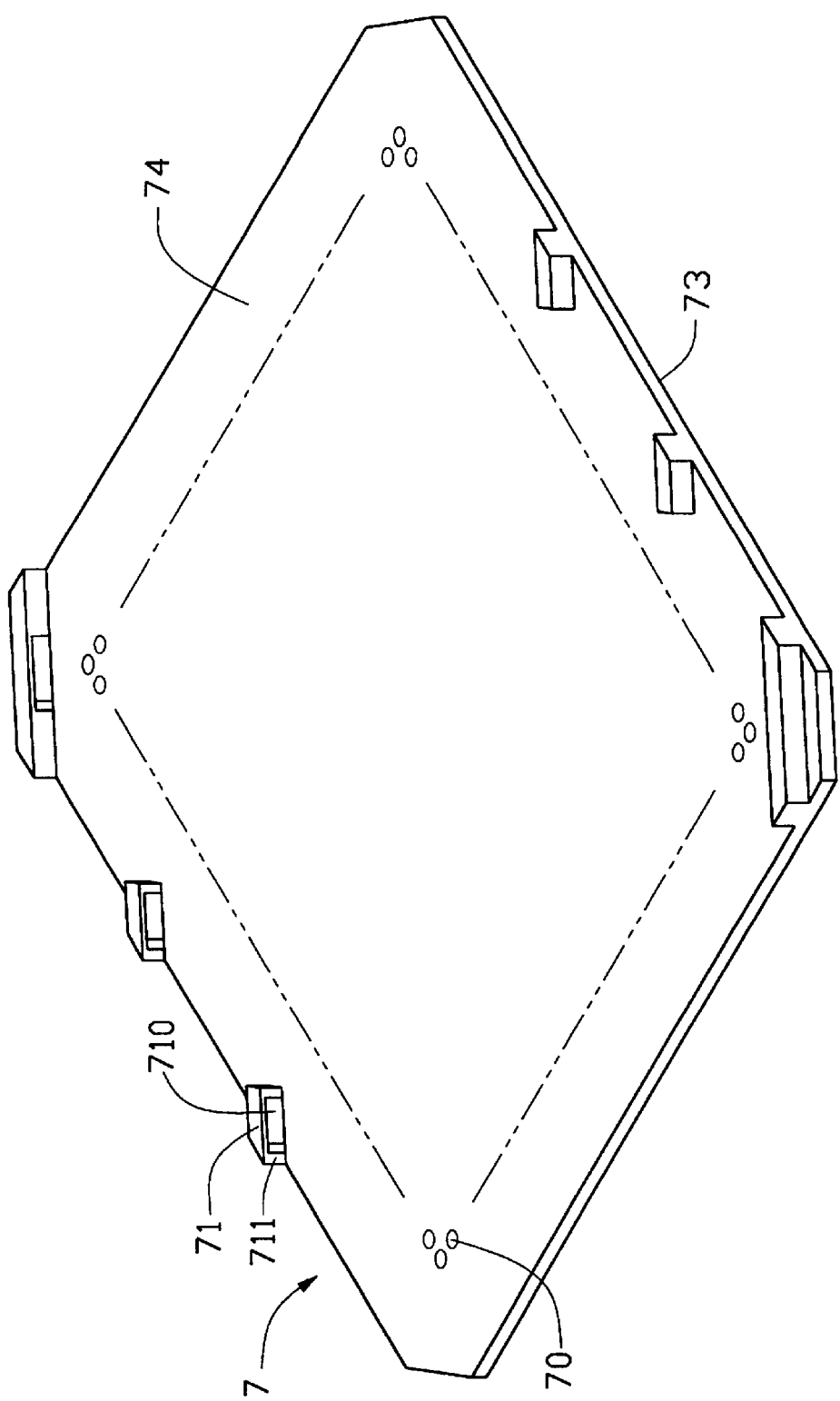
FIG. 4 is a perspective view of a cover of the present invention.

Referring to FIGS. 3 and 4, a BGA socket 1 of the present invention comprises an insulative cover 7 and a base 6. The cover 7 is slidable along the base 6 in a diagonal direction X of the cover 7 indicated by a label 72 proximate one corner of the cover 7. The cover 7 having a top surface 73 and a bottom surface 74 opposite the top surface 73 defines a plurality of apertures 70 therein between the top the bottom surfaces 73, 74. A plurality of elongate standoffs 71 downwardly projects from the bottom surface 74 proximate a pair of opposite edges and a pair of opposite corners of the cover 7. Each standoff 71 has a lateral face 711 parallel to the direction X. An opening 710 is formed in each standoff 71 between the lateral face 711 and the top surface 73 of the cover 7 for facilitating a molding process of the cover 7.

The base 6 includes an insulative planar body 64 defining a plurality of passageways 61 between opposite surfaces thereof in alignment with the apertures 70 of the cover 7. A plurality of terminals 62 is received in the passageways 61. A plurality of triangular plates 60 project from a pair of opposite edges and a pair of opposite corners of the base 6 in alignment with the standoffs 71 of the cover 7. Each triangular plate 60 has a lateral face 602 parallel to the direction X. A barb 600 projects from each lateral face 602.

Figure 5:
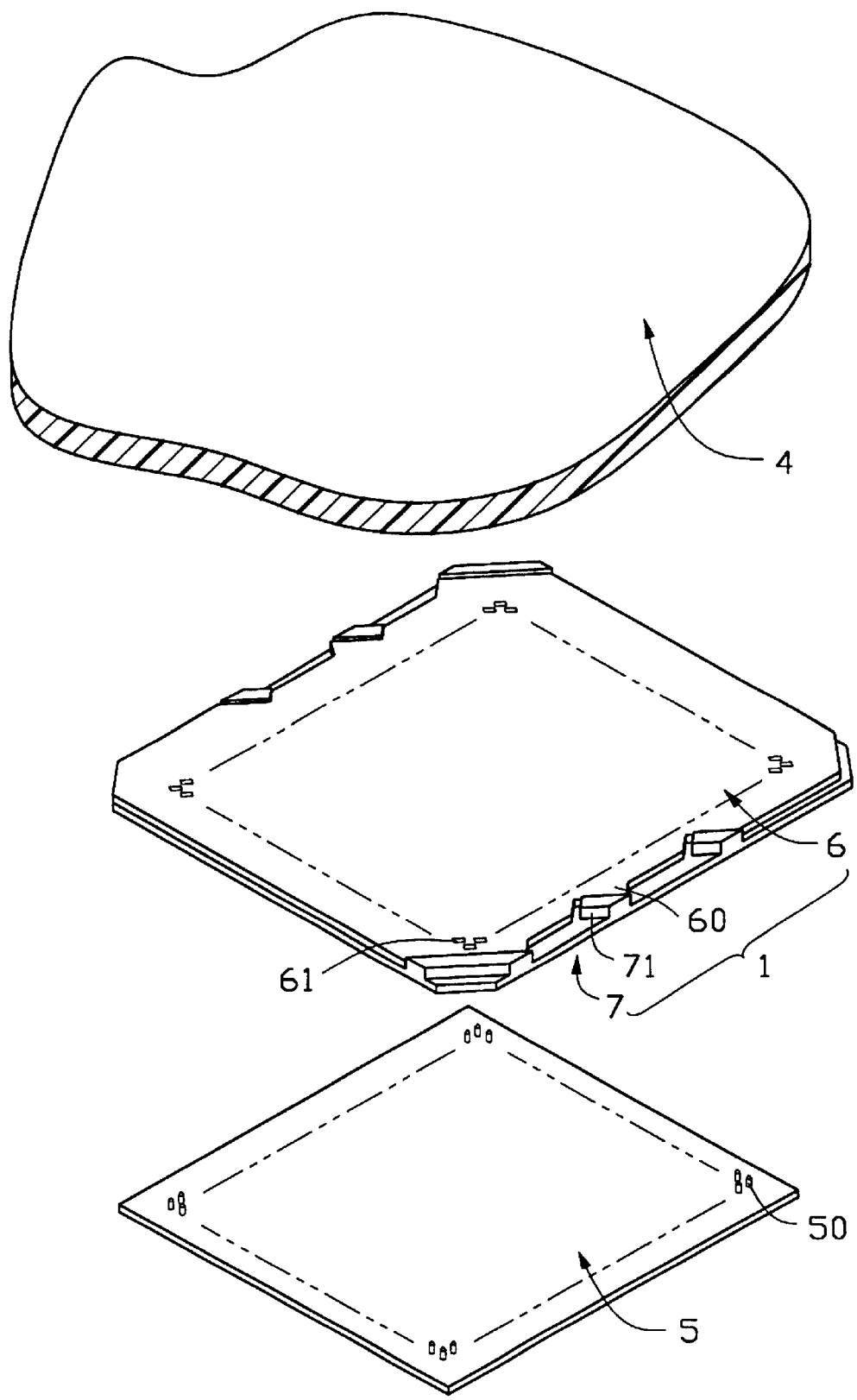
FIG. 5 is a perspective view showing the BGA socket of the present invention, a CPU and a mother board.

Also referring to FIG. 5, when the base 6 and the cover 7 are assembled together, the base 6 is attached to the bottom surface 74 of the cover 7. The barbs 600 of the base 6 are slidably received in the corresponding openings 710. Thus, the cover 7 is slidable along the base 6 in the direction X. When pins 50 of a CPU 5 are inserted through the apertures 70 into the passageways 61, a horizontal movement of the cover 7 along the base 6 actuates the pins 50 to engage with the terminals 62.

Figure 6A:
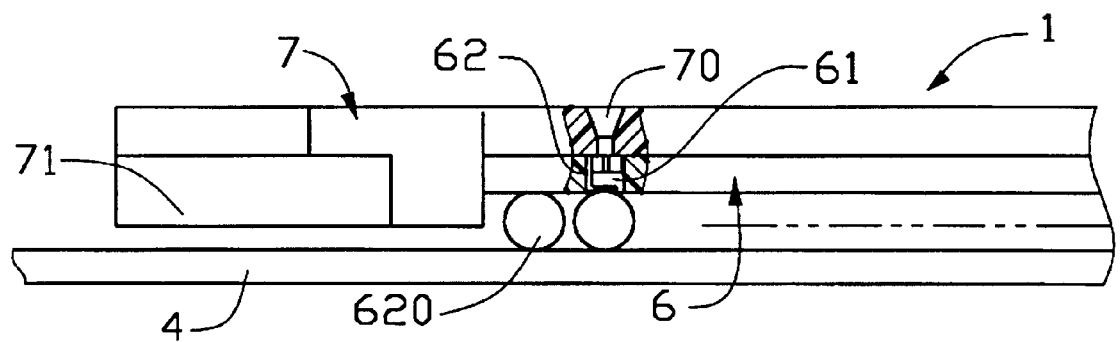
FIG. 6A is a partial side view showing the BGA socket of the present invention, a plurality of solder balls and a mother board before the solder balls become molten by heating.
Figure 6B:
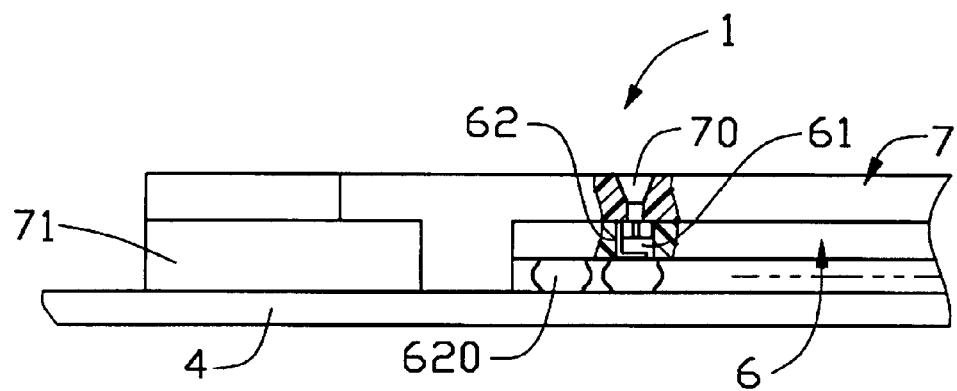
FIG. 6B is similar to FIG. 6A showing the solder balls after becoming molten.

Referring to FIGS. 6A and 6B, the standoffs 71 extend beyond a bottom surface of the base 6. When the BGA socket 1 is arranged on a mother board 4, a plurality of solid solder balls 620 is disposed therebetween under the passageways 61. The solder balls 620 support the BGA socket 1 such that a bottom surface of the BGA socket 1 is spaced from the mother board 4. The solder balls 620 are heated and become molten to electrically connect tails of the terminals 62 to the mother board 4. Since the molten solder balls 620 can not properly support the BGA socket 1, bottoms surfaces of the standoffs 71 of the cover 7 abut against the mother board 4 to support the BGA socket 1. Thus, the BGA socket 1 remains parallel to the mother board and a height of the BGA socket 1 above the mother board 4 can be easily control. Further, the molten solder balls 620 are not squashed by the BGA socket 1 as in the prior art so that the molten solder is unlikely to wick into the passageways 61 and adversely affect performance of the terminals.

It should be noted that the standoffs 71 could be arranged on the base 6 to achieve the same function. However, the bottom surface of the base 6 is required to be kept flat for facilitating disposal of the solder balls 620 thereon. Alternatively, the standoffs 71 can be mounted on the base 6 after the solder balls 620 are disposed on the bottom surface of the base 6. Such a method is apparently time and cost inefficient compared to the embodiment discussed above.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to. the full extent indicated by the broad general meaning of the terms in which the appended claims are expressed.

What is claimed is:

1. An electrical socket mounted on a mother board for engaging with a CPU and electrically connecting the CPU to the mother board comprising:

a base having a first surface and a second surface opposite the first surface, the base including an insulative body defining a plurality of passageways between the first and second surfaces;

a plurality of terminals received in the passageways for engaging with connecting pins of the CPU;

a plurality of solder balls disposed between the base and the mother board for being soldered to connect the terminals and the mother board for soldering the terminals to said mother board; and an insulative cover having a third surface and a fourth surface opposite the third surface and facing the first surface and including a plurality of apertures aligned with the passageways, a plurality of standoffs projecting from the fourth surface proximate edges of the cover, the cover being slidably attached to the base, the standoffs abutting against the mother board after the solder balls are soldered to the mother board.

2. The electrical socket as claimed in claim 1, wherein each standoff is elongate and has a lateral face, the lateral faces being parallel to each other.

3. An electrical assembly comprising:

an electrical socket including a base with a plurality of terminal therein;

a mother board positioned below the base;

a plurality of solder balls sandwiched between the base and the mother board, and soldered to the corresponding terminals; and a cover positioned atop the base and including a plurality of standoffs along a circumference thereof; wherein said standoffs not only engage the base for guiding slidable movement of the cover relative to the base but also provide proper vertical space for the molten solder balls because the standoffs are directly seated on the mother board.

\* \* \* \* \*